United States Patent [19]

Fujimoto

[11] Patent Number: 4,555,808
[45] Date of Patent: Nov. 26, 1985

[54] TUNER APPARATUS

[75] Inventor: Isao Fujimoto, Katano, Japan

[73] Assignee: Sanyo Electric Co., Ltd., Osaka, Japan

[21] Appl. No.: 446,356

[22] Filed: Dec. 2, 1982

Related U.S. Application Data

[63] Continuation of Ser. No. 185,138, Sep. 8, 1980, abandoned.

[30] Foreign Application Priority Data

Sep. 14, 1979 [JP] Japan .............................. 55-118597
Jan. 19, 1980 [JP] Japan .................................. 56-4961

[51] Int. Cl.$^4$ .......................... H03J 3/24; H04B 1/06
[52] U.S. Cl. ...................................... 455/180; 334/15; 455/189; 455/190; 455/191
[58] Field of Search ............................ 334/11, 14, 15; 358/191.1; 455/179, 180, 185, 187, 188, 191, 190

[56] References Cited

U.S. PATENT DOCUMENTS

| | | | |
|---|---|---|---|
| 3,983,490 | 9/1976 | Ma | 334/15 |
| 4,005,256 | 1/1977 | Arumugham | 334/15 |
| 4,081,771 | 3/1978 | Hendrickson | 334/15 |
| 4,138,653 | 2/1979 | Midgley | 334/15 |
| 4,145,659 | 3/1979 | Wolfram | 334/15 |
| 4,249,256 | 3/1981 | Molinari et al. | 334/15 |

Primary Examiner—Benedict V. Safourek
Attorney, Agent, or Firm—Armstrong, Nikaido, Marmelstein & Kubovcik

[57] ABSTRACT

A television tuner comprises a voltage controlled variable capacitance diode provided in common to the UHF band, the VHF high band and the VHF low band. A tuning voltage provided from a channel selecting apparatus is applied to the variable capacitance diode as a control voltage. A relation between the tuning voltage and the receiving frequencies is selected such that the tuning voltage of the high end channel (the maximum receivable frequency) of the UHF band is higher than the tuning voltages of the respective high end channels of the remaining bands and the tuning voltage of the low end channel (the minimum receivable frequency) of the VHF low band is lower than the tuning voltage of the respective low end channels of the remaining bands. The channel selecting apparatus is adapted to restrict the upper and lower limits of the tuning voltage, whereby the upper limit of the receivable frequency of the UHF band is restricted and the lower limit of the receivable frequency of the VHF low band is restricted.

11 Claims, 24 Drawing Figures

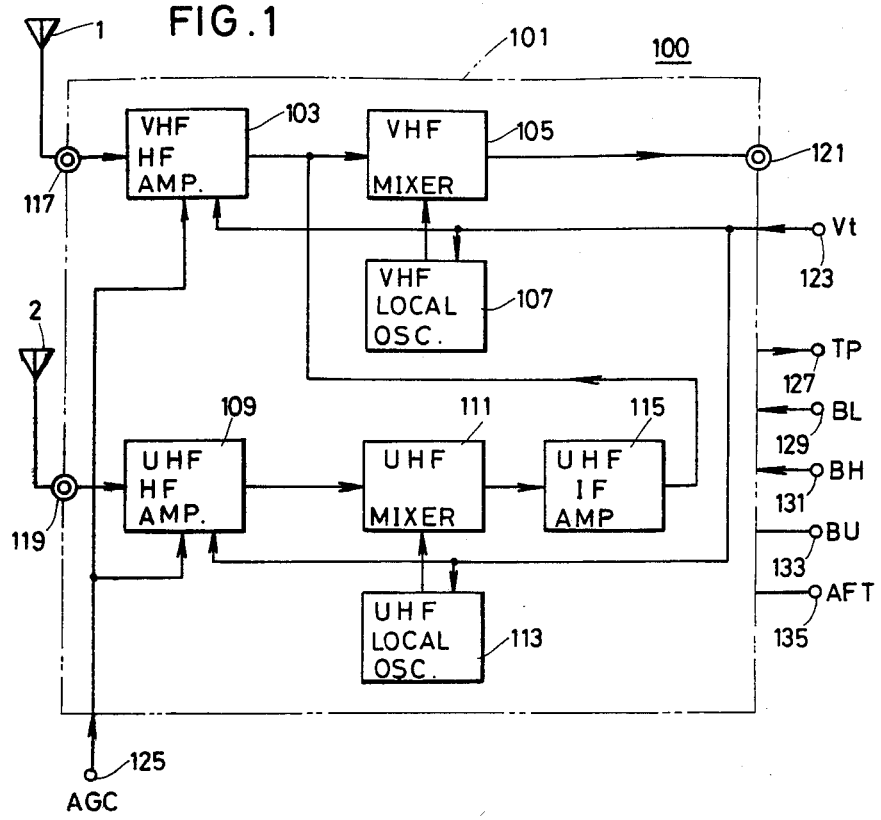
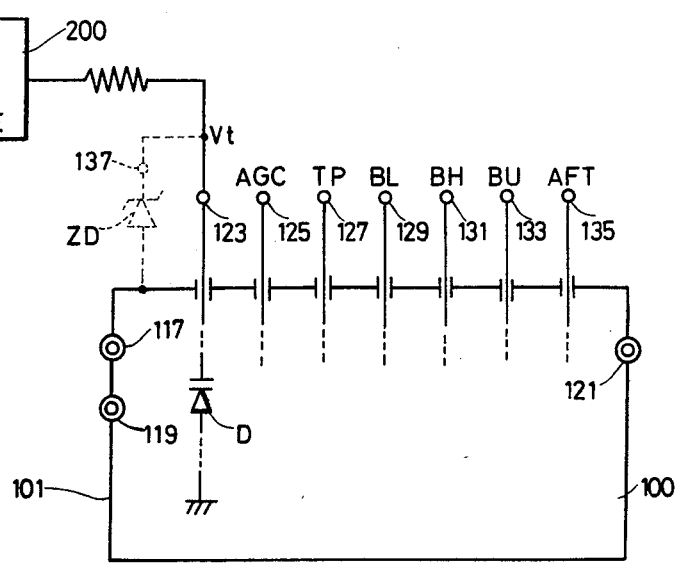

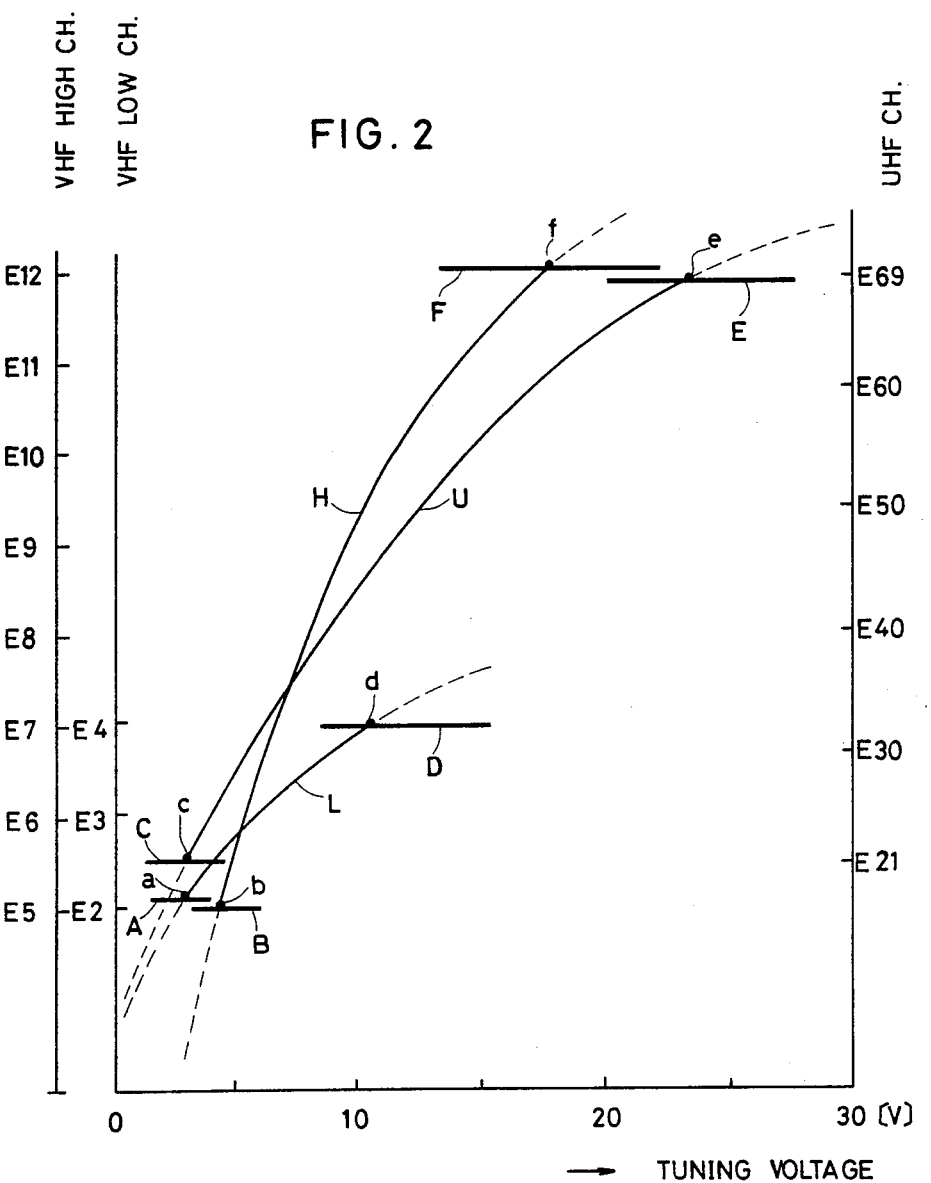
FIG. 2
FIG. 3
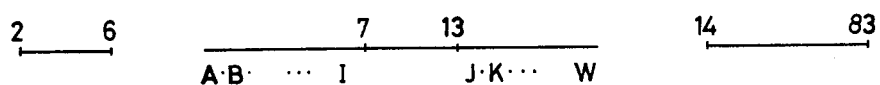

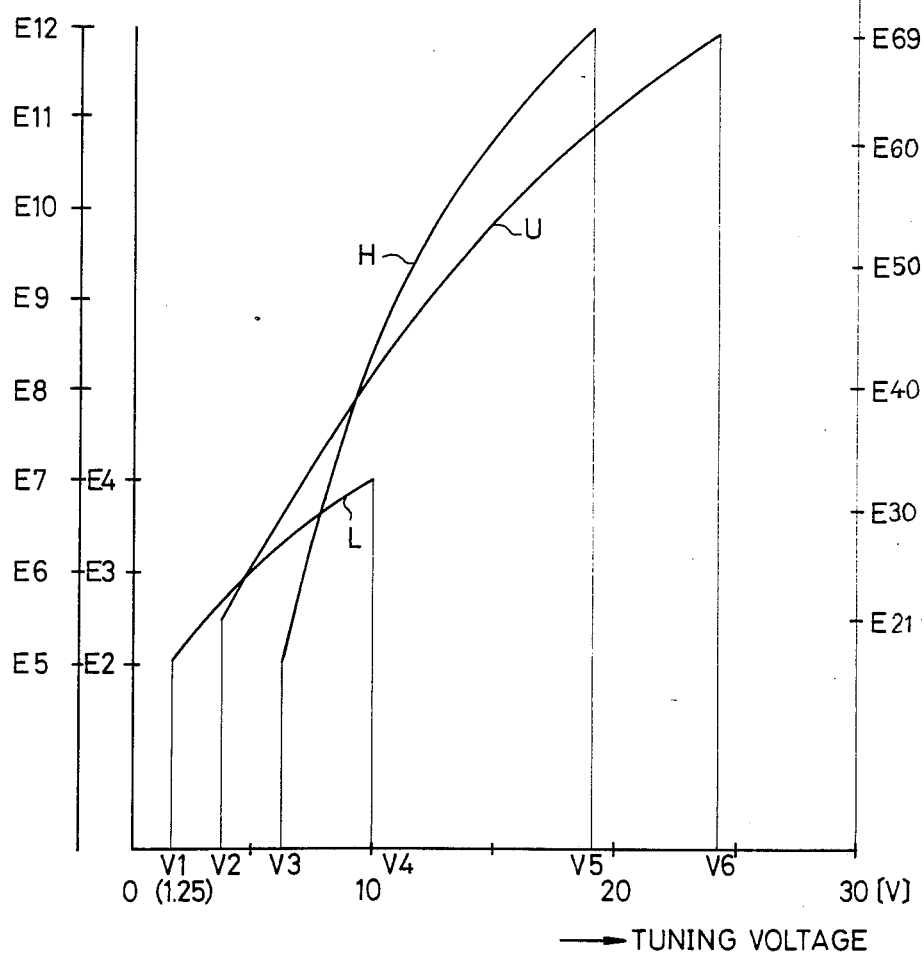

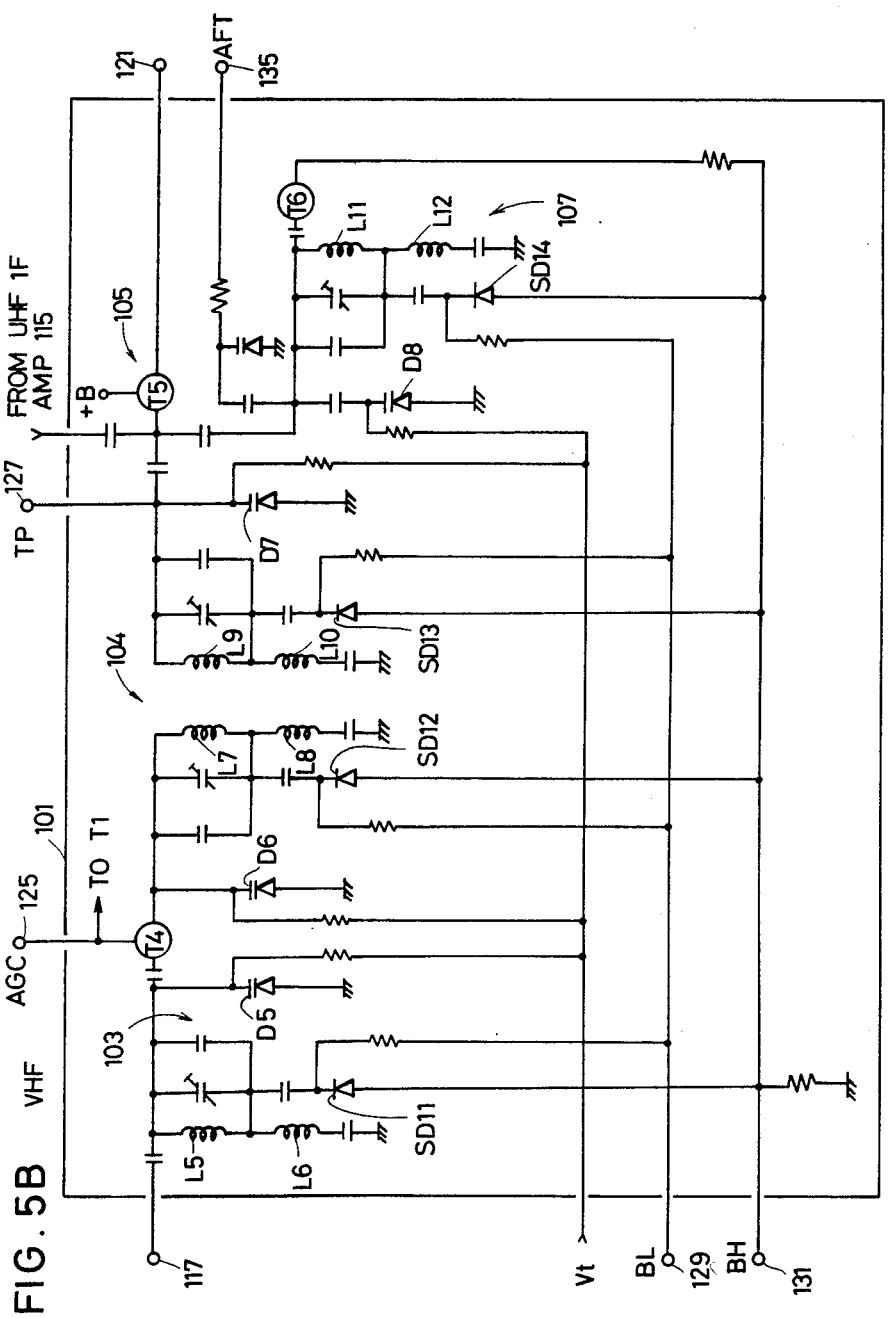

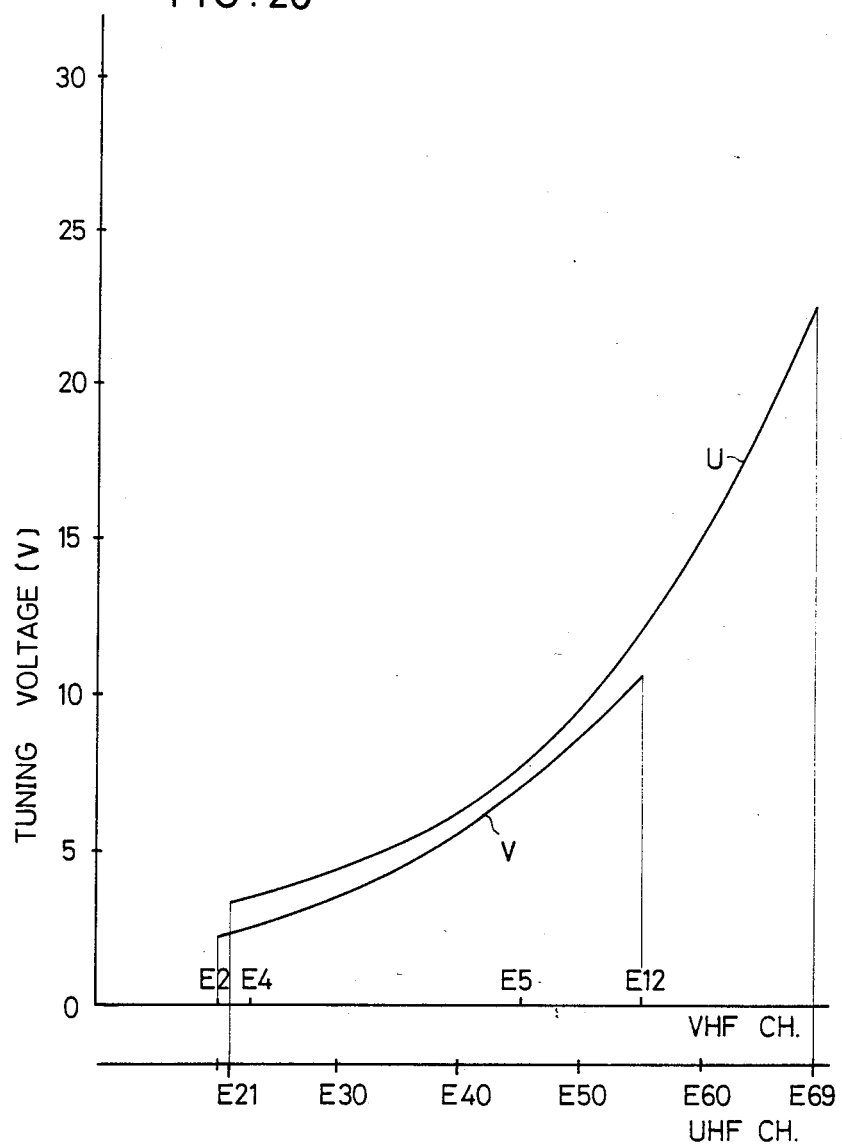

TUNER APPARATUS

This is a continuation, of application Ser. No. 185,138, filed Sept. 8, 1980, now abandoned.

BACKGROUND OF THE INVENTION

1. Field of the Invention

The present invention relates to a tuner apparatus. More specifically, the present invention relates to a tuner apparatus employing a voltage controlled variable reactance device such as a voltage controlled variable capacitance diode for use in a television receiver, an FM receiver and the like.

2. Description of the Prior Art

FIG. 1 is a block diagram showing one example of a tuner apparatus of a television receiver of the superheterodyne system wherein the present invention can be advantageously employed. Since such television tuner is well-known to those skilled in the art, only those portions associated with the present invention will be briefly described. A tuner 100 comprises two input terminals 117 and 119. The input terminal 117 is connected to receive a television signal received by a VHF antenna 1. The input terminal 119 is connected to receive a television signal received by a UHF antenna 2. The received signal from the VHF antenna input terminal 117 is applied to a VHF high frequency amplifier 103 and is amplified and the amplified output therefrom is applied to a VHF mixer 105. The tuner 100 also comprises a VHF local oscillator 107. The oscillation output of the VHF local oscillator 107 is applied to a VHF mixer 105. Accordingly, the VHF mixer 105 serves to mix the VHF television signal with the oscillation output from the VHF local oscillator 107, thereby to convert the VHF television signal into a VHF intermediate frequency signal. On the other hand, the received signal applied to the UHF antenna input terminal 119 is applied to a UHF high frequency amplifier 109 and is amplified and the amplified output therefrom is applied to a UHF mixer 111. The tuner 100 also comprises a UHF local oscillator 113 and the oscillation output therefrom is applied to a UHF mixer 111. Accordingly, the UHF mixer 111 serves to mix the UHF television signal with the oscillation output from the UHF local oscillator 113, thereby to convert the UHF television signal into a UHF intermediate frequency signal. The output from the UHF mixer 111, i.e. the UHF intermediate frequency signal is amplified by a UHF intermediate frequency amplifier 115 and is applied to a VHF mixer 105. On the occasion of reception of the UHF signal, the VHF high frequency amplifier 103 and the VHF local oscillator 107 are disabled, while the VHF mixer 105 is kept enabled. Accordingly, on the occasion of reception of the UHF signal, the VHF mixer 105 serves as a UHF intermediate frequency amplifier for amplifying the UHF intermediate frequency signal. Meanwhile, on the occasion of reception of the VHF signal, those circuits 109, 111, 113 and 115 associated with the UHF signal are all disabled, while only those circuits 103, 105 and 107 associated with the VHF signal are enabled. The VHF intermediate frequency signal or the UHF intermediate frequency signal obtained from the VHF mixer 105 is applied from the output terminal 121 to the subsequent stage intermediate frequency circuit, not shown. These circuits 103 to 115 are housed within a shield member 101 of such as a metallic casing or frame. Therefore, any undesired radiation from those circuits housed within the shield member 101 toward other wireless equipment is effectively prevented, while any undesired electric wave or interference electric wave from other wireless equipment to those circuits is also effectively prevented. The above described antenna input terminals 117 and 119 and the intermediate frequency output terminal 121 are formed at predetermined positions of the shield member 101, while these terminals are electrically isolated from the shield member 101.

The VHF high frequency amplifier 103, the VHF local oscillator 107, the UHF high frequency amplifier 109 and the UHF local oscillator 113 each comprise a tuning circuit, not shown, for varying the tuning frequency for selection of a desired channel with a desired receiving frequency band. Each of these tuning circuits comprises a voltage controlled variable reactance device such as a voltage controlled variable capacitance diode. To that end, the tuner 100 housed in the shield member 101 is also provided with a tuning voltage input terminal 123, as electrically isolated from the shield member 101, for supply of the tuning voltage Vt. The tuning voltage Vt from the terminal 123 is applied to the associated circuits 103, 107, 109 and 113. The shield member 101, i.e. the tuner 100, further comprises a test point (TP) terminal 127, as electrically isolated from the shield member 101, for supply of the output from the tuner 100 to alignment equipment, not shown, for alignment of the output waveform on the occasion of adjustment of the tuner 100. In general, the VHF band comprises a VHF low band (the first band) of a relatively low frequency range and a VHF high band (the second band) of a relatively high frequency range. On the other hand, the UHF band may be considered as the third band of a frequency range higher than that of the VHF high band. Accordingly, the tuner 100 further comprises terminals 129, 131 and 133, as electrically isolated from the shield member 101, for supply of voltage signals for selection of these frequency bands. More specifically, the terminal 129 is aimed to supply a band selection voltage BL for selection of the VHF low band, the terminal 131 is aimed to provide band selection voltage BH for selection of the VHF high band, and the terminal 133 is aimed to provide a band selection voltage BU for selection of the UHF band. The tuner 100 further comprises a terminal 125 for supply of an automatic gain control (AGC) voltage obtained from the intermediate frequency circuit, not shown, and a terminal 135 for supply of an automatic fine tuning (AFT) voltage, both electrically isolated from the shield member 101. Each of the terminals 129, 131 and 133 is supplied with the band selection voltage BL, BH or BU of +15 V, when the corresponding receiving frequency band is to be selected. Each of the tuning circuits included in the tuner 100 is structured to be responsive to the given band selection voltage BL, BH or BU or change the circuit constant or circuit connection of the tuning scheme so as to be adaptable to the corresponding frequency band, as well-known to those skilled in the art.

As described in the foregoing, the tuner 100 employs a voltage controlled variable capacitance diode is a tuning element of each of the tuning circuits. In such conventional tuner, the tuning voltage Vt being supplied to the variable capacitance diode was determined in accordance with a given condition. In the following, therefore, such determination of the tuning voltage will be described with reference to an example of a television tuner in West Germany, as shown in FIG. 2. Referring to FIG. 2, the abscissa indicates the tuning voltage and the ordinate indicates the respective channels in the VHF low band, the VHF high band and the UHF band. In West Germany, for example, the VHF low band (the first band) covers channels E2 to E4, while the VHF high band (the second band) covers channels E21 to E12. The UHF band (the third band) covers channels E21 to E69. Such tuner has been designed such that the lower limit frequency of the VHF low band may be determined so that channel E2 can be received when the tuning voltage Vt is 3 V, for example. However, a television tuner must be capable of surely selecting channel E2 even in any situation and even in the worst condition. More specifically, in consideration of a frequency drift due to a source voltage fluctuation, an ambient temperature variation, a time dependent change and so on, a frequency deviation due to a mechanical shock, and the like, the television tuner must be designed to be capable of surely receiving channel E2 even in the worst condition which seldom occurs. Therefore, accordingly to a conventional approach, the tuner was designed such that the tuning voltage Vt which is as low as 0.2 to 0.3 V, for example, and is sufficiently lower than the above described 3 V, may be supplied from the channel selecting apparatus, not shown. As a result, with such a conventional television tuner, the receivable frequency range extended over the lower region beyond the necessary receivable frequency range shown by the dotted line in FIG. 2 in a normal use condition. For example, a conventional tuner was adapted such that in the case of the VHF low band shown by the curve L in FIG. 2 the signal can be received even when the frequency becomes lower than that of channel E2 by a frequency difference corresponding to approximately one channel. A conventional tuner was further adapted such that in the case of the VHF high band shown by the curve H the signal can be received even when the frequency becomes lower than the lower limit channel E5 by a frequency difference corresponding to approximately three channels. A conventional tuner was further adapted such that in the case of the UHF band shown by the curve U the signal can be received even when the frequency becomes lower than the lower limit channel E21 by a frequency difference corresponding to approximately ten channels. A conventional television tuner was further adapted such that as for the upper limit of the respective bands as well the signal of any desired receiving frequency band can be surely received with a sufficient margin in full consideration of any imaginable worst condition.

However, for the purpose of effective utilization of the electric wave and observance of secrecy of communication, in some countries there have been tendencies to restriction of reception by a tuner beyond the receivable frequency range in a television receiver, for example. More specifically, some countries have shown tendencies to legislation to restrict the receivable frequency range by a tuner in a television receiver at the upper and lower limits of the respective receiving frequency bands as shown in FIG. 2, with a margin frequency corresponding to one channel, respectively.

For example, in West Germany, the FTZ (Fermnelde Technisches Zentralamt) has made the following proposal in the draft of January, 1979. More specifically, in West Germany the frequency range for the television broadcasting has been determined such that the Band I covers 47 MHz to 68 MHz, the Band III covers 174 MHz to 230 MHz and the Bands IV and V cover 470 MHz to 790 MHz. A deviation allowance outside the frequency range at each of the upper and lower limits of the frequency range of each band has been determined in principle as 300 kHz. By way of an exception, as for the receiving frequency band of 47 MHz to 870 MHz, a deviation allowance outside the frequency range has beed determined as 7 MHz at the lower limit of the frequency range and as 8 MHz at the upper limit of the frequency range.

An attempt has also been made to make similar restriction in the case of the Canadian television broadcasting shown in FIG. 3. According to the Canadian television broadcasting standard, the VHF low band comprises Channel Nos. 2 to 6, the VHF high band comprises Channel Nos. 7 to 13, and the UHF band comprises Channel Nos. 14 to 84. According to the draft of October, 1978 by the Canadian DOC (Department of Communications) and the further developments thereof, the following restriction has been planed. More specifically, according to the Canadian television broadcasting standard, the channels for the CATV have been allotted in the region lower than Channel No. 7 and in the region higher than Channel No. 13. Therefore, a restriction has been planned in Canadian television receivers such that some of the CATV channels allotted in the region lower than Channel No. 7 and in the region higher than Channel No. 13 are made absolutely unreceivable. More specifically, television receivers originally not designed to receive such CATV broadcasting are sufficient enough to be capable of surely receiving only the television signal of Channel Nos. 2 to 6, Nos. 7 to 13, and Nos. 14 to 83 and therefore a restriction has been planned to make such receivers incapable of receiving a signal in Channels A to I of the CATV channels in the region lower than Channel No. 7 and a signal in CATV Channels A to W in the region higher than Channel No. 13. In making sucn restriction, however, one channel, i.e. Channel I in the region immediately lower than Channel No. 7 and one channel, i.e. Channel J in the region immediately higher than Channel No. 13 have been considered as allowable for a deviation range.

As described in the foregoing, in some countries there have been tendencies to a strict restriction to a deviation downward or upward from the original receiving frequency band, for the purpose of effective utilization of an electric wave and observance of communication secrecy.

Under the circumstances, in order to cope with such strict frequency restriction, one might think of restriction of the upper and lower limits of the above described tuning voltage. However, generally tuner apparatuses involve a diversified tuning voltage versus receiving frequency characteristic depending on each set. Referring to FIG. 2, such diversification is shown by ranges denoted as A to F in conjunction with the points a to f of the lower and upper ends of the respective receiving bands U, H and L. For example, as far as the upper ends of the UHF band and the VHF high band are concerned, it could happen that a given tuner involves a relation in which the tuning voltage of the high end channel of the UHF band is lower than the tuning voltage of the high end channel of the VHF high band. The same is also true in a relation between the tuning voltage of the low end channel of the VHF high band and the tuning voltage of the low end channel of the VHF low band. Thus, in the case where there is a diversification in a relation of which is higher and lower between the tuning voltage of the high end channel and/or the tuning voltage of the low end channel among the respective bands, the above described restriction to the tuning voltage requires that such tuning voltage restricting means be provided for each of the receiving bands. For example, in restricting the upper limit of the receivable frequency of the UHF band so as to be conformable to the FTZ standard, assuming such a relation as shown in FIG. 2, the upper limit of the tuning voltage from the tuning voltage generating means, not shown, can not be uniformly set to the minimum value, say 20 V, of a diversification range E. This can be substantiated by an assumption that when the high end channel of the VHF high band is receivable with the tuning voltage being say 22 V then such high end channel becomes unreceivable by such setting. Accordingly, it becomes necessary to restrict both the upper and lower limits of the tuning voltage for each of the receiving bands. Provision of such tuning voltage restricting means for each of the receiving bands, however, makes complicated the structure of the tuner apparatus and makes expensive the cost of the tuner apparatus.

SUMMARY OF THE INVENTION

Briefly described, the inventive tuner apparatus comprises a voltage controlled variable reactance device provided in common to a plurality of receiving bands and being supplied with a tuning voltage from a single tuning voltage generating means. The tuner apparatus further comprises means for restricting the upper and lower limits of the tuning voltage being applied. The inventive tuner apparatus is adapted to establish a relation in which the tuning voltage for tuning to the maximum receivable frequency of one receiving band among the plurality of receiving bands is equal to or higher than the tuning voltage for tuning to the maximum receivable frequency of the remaining receiving bands and the tuning voltage for tuning to the minimum receivable frequency of the remaining one receiving band among the plurality of receiving bands is equal to or lower than the tuning voltage for turning to the minimum receivable frequency of the remaining receiving band. Therefore, according to the present invention, it is not necessary to provide a tuning voltage restricting means for each of the receiving bands in restricting a variation range of the tuning frequency already restricted or being restricted in the future. Accordingly, the tuning frequency of the inventive tuner apparatus can be assuredly adapted to the frequency range as restricted with a simple circuit configuration.

In a preferred embodiment of the present invention the tuning voltage generating means may be of a voltage synthesizer type. The tuning voltage generating means of such voltage synthesizer type comprises a switching device being rendered conductive responsive to a pulse signal and a smoothing circuit for smoothing the output of the switching device. In such embodiment, impedance means is interposed in a current path of the switching device for allowing a predetermined residual voltage to be applied to the smoothing circuit even when the switching device is rendered conductive. According to the above described preferred embodiment, the lower limit of the tuning voltage can be restricted with a very simple structure.

In another preferred embodiment of the present invention, the tuning voltage generating means comprises potentiometers each provided for each channel, so that the source voltage is divided by each of the potentiometers to provide the tuning voltage corresponding to each channel. A diode is connected to a sliding contact of each potentiometer, the anode of each diode being commonly connected to the input electrode of a transistor. The second electrode of the transistor is connected to the voltage source and the third electrode of the transistor is connected to the tuning voltage withdrawing terminal. A predetermined output resistor is connected between the tuning voltage withdrawing terminal and the ground potential. The source voltage is stabilized by a constant voltage diode, whereby the upper limit of the tuning voltage obtained from the tuning voltage withdrawing terminal is restricted. A predetermined resistor is connected between the voltage source and the output resistor, so that normally a constant current is caused to flow through the output resistor, whereby the lower limit of the voltage across the output resistor or the output voltage (the tuning voltage) obtained from the tuning voltage withdrawing terminal is restricted to a predetermined value. In the above described preferred embodiment, the lower limit of the tuning voltage can be restricted only be adding one resistor to a conventional tuning voltage generating means, while the upper limit of the tuning voltage can also be restricted only by using a constant voltage diode, with the result that a tuner apparatus adapted for restriction of the tuning frequency can be provided with a very simple structure.

Accordingly, a principal object of the present invention is to provide a tuner apparatus assuredly adaptable to restriction of a variation range of the tuning frequency with a simple structure.

Another object of the present invention is to provide a tuner apparatus assuredly adaptable to restriction of the tuning frequency with an inexpensive cost.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing one example of a conventional television tuner wherein the present invention can be advantageously employed;

FIG. 2 is a graph showing a relation between the tuning voltage and the frequency (the receiving channels) of a television system proposed in West Germany for explaining the background of the present invention;

FIG. 3 is a graph showing the distribution of channels of the television broadcasting standard in Canada;

FIG. 4 is a graph showing a relation between the tuning voltage and the frequency (the receiving channels) for explaining the principle of the present invention;

FIGS. 5A and 5B are schematic diagrams of a television tuner taken as an example of the present invention, wherein FIG. 5A shows a UHF portion and FIG. 5B shows a VHF portion;

FIG. 6 is an outline view for explaining one embodiment of the present invention;

FIG. 20 is a graph showing a relation between the tuning frequency (the receiving channel) and the tuning voltage for explaining the FIG. 19 embodiment.

DESCRIPTION OF THE PREFERRED EMBODIMENTS

Figure 5A:
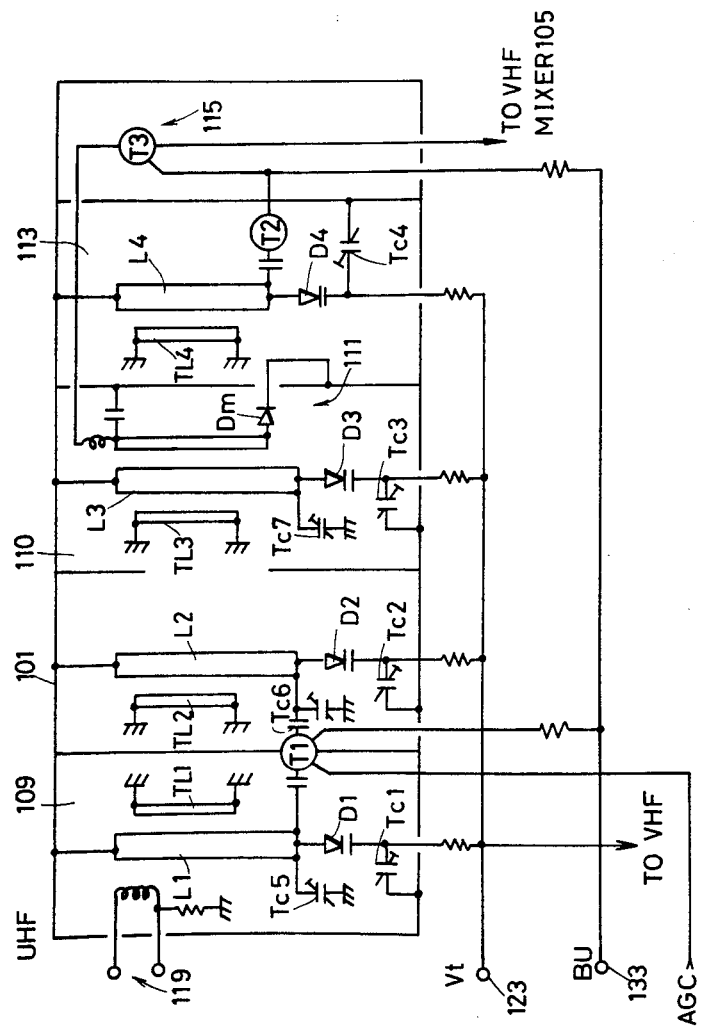

In the following description the present invention will be described by taking several examples wherein the present invention is embodied in a television tuner; however, it is pointed out that the present invention can be applied not only to a television tuner but also to an FM receiver and the like.

Briefly, the principle of the present invention is that a tuner apparatus is adapted to establish a receiving frequency characteristic between the tuning frequencies of a plurality of receiving bands and the tuning voltage such that the tuning voltage for tuning to the maximum receivable frequency in one receiving band is equal to or higher than the tuning voltage for tuning to the maximum receivable frequency in the remaining receiving band and the tuning voltage for tuning to the minimum receivable frequency in the remaining one receiving band among the plurality of receiving bands is equal to or lower than the tuning voltage for tuning to the minimum receivable frequency in the remaining receiving bands.

FIG. 4 is a graph showing one example of such receiving frequency characteristic, in which the abscissa indicates the tuning voltage and the ordinate indicates the tuning frequencies (the receiving channels) in the respective receiving bands of the VHF low band, the VHF high band and the UHF band. In the embodiment shown, it is assumed that the tuning voltage for tuning to the upper limit frequency (the maximum receivable frequency) of the UHF band is V6, the tuning voltage for tuning to the upper limit frequency in the VHF high band is V5, and the tuning voltage for tuning to the upper limit frequency in the VHF low band is V4. Further, it is assumed that the tuning voltage for tuning to the lower limit frequency (the minimum receivable frequency) in the VHF low band is V1, the tuning voltage for tuning to the lower limit frequency of the VHF high band is V2, and the tuning voltage for tuning to the lower limit frequency in the UHF band is V3. The relation of these voltages V1 to V6 is selected to be V6>V5, V6>V4, V1<V2 and V1<V3. More specifically, adjustment is made such that in the UHF band when the tuning voltage V6 is applied the high end channel E69 can be assuredly received but the channel E69+8 MHz cannot be exceeded as the upper limit value. On the other hand, adjustment is made such that in the VHF low band in the case of the tuning voltage V1 the low end channel E2 can be assuredly received but the channel E2−7 MHz is exceeded. The lower limit frequency of the UHF band is restricted by the tuning voltage V3 and the upper limit and the lower limit frequencies of the VHF high band are restricted by the tuning voltages V5 and V2, and the upper limit frequency of the VHF low band is restricted by the tuning voltage V4. Alternatively, the tuning voltages V1 to V6 may be set in a relation of V6=V5=V4 and V1=V2=V3. It is pointed out that the examples of the tuning voltage generating means to be described subsequently are structured to generate the tuning voltage in common to the respective receiving bands in accordance with the last mentioned relation.

FIGS. 5A and 5B are schematic diagrams of an example of a television tuner in accordance with the present invention. FIG. 5A shows a UHF associated portion and FIG. 5B shows a VHF associated portion. These UHF and VHF portions are implemented in a unitary tuner housed within a single shield member 101; however, these portions are shown as housed in separate shield members 101 in FIGS. 5A and 5B for simplicity of illustration.

Referring to FIG. 5A, first the UHF portion will be described. The shield member 101 is partitioned into suitable cells by suitable shield plates. A UHF high frequency amplifier 109 including an input tuning circuit is provided within the first cell. An inter stage tuning circuit 110 is housed within the next cell and is disposed between the UHF high frequency amplifier 109 and a UHF mixer 111. A mixer diode Dm constituting a UHF mixer 111 is disposed within the same cell as the interstage tuning circuit 110. The UHF high frequency amplifier 109 comprises an input tuning circuit, which comprises a resonance circuit including a first voltage controlled variable capacitance diode D1 and a first resonance conductor L1. The resonance circuit serves to select a desired one of the broadcasting signals in the UHF band fed from the UHF antenna input terminal 119. An amplifying transistor T1 amplifies the selected UHF television signal. The amplified television signal is applied to a primary resonance circuit of the interstage tuning circuit 110. The primary resonance circuit comprises a second voltage controlled variable capacitance diode D2 and a second resonance conductor L2. The primary resonance circuit is electromagnetically coupled to the secondary resonance circuit. The secondary resonance circuit comprises a third voltage controlled variable capacitance diode D3 and a third resonance conductor L3. Accordingly, the television signal amplified by the transistor T1 is fed through the coupling between the primary resonance circuit and the secondary resonance circuit to the anode of the mixer diode Dm. On the other hand, the UHF local oscillator 113 comprises an oscillation transistor T2, a fourth voltage controlled variable capacitance diode D4 and a fourth resonance conductor L4. The oscillation output from the UHF local oscillator 113 is applied to the cathode of the mixer diode Dm. Accordingly, the mixer diode Dm serves to mix the two fed frequency signals, thereby to provide an UHF intermediate frequency signal, which is applied to an UHF intermediate frequency amplifier 115. The UHF intermediate frequency amplifier 115 comprises an amplifying transistor T3, the output of which is applied to a VHF mixer 105 shown in FIG. 5B. The tuning voltage Vt obtained from the tuning voltage terminal 123 of the tuner 100 is commonly applied to the first, second, third and fourth voltage controlled variable capacitance diodes D1, D2, D3 and D4 constituting the respective resonance circuits. The tuning voltage Vt is also applied to the VHF portion shown in FIG. 5B. An UHF band selecting voltage BU obtained from a terminal 133 is applied to the transistors T1, T2 and T3. Accordingly, these transistors T1 to T3 are enabled upon application of the voltage BU from the terminal 133.

Frequency adjustment of the UHF portion will be made in the following manner. For the purpose of ajusting the tuning frequency in the UHF portion, first the voltage BU is applied to the terminal 133. As the tuning voltage Vt being applied to the terminal 123, the tuning voltage V6 shown in FIG. 4, for example, is determined. Then the local oscillation frequency of the UHF local oscillator 113 is adjusted. The frequency adjustment is made with the trimmer loop TL4 coupled to the fourth resonance conductor L4. The local oscillation frequency at that time is adjusted such that the same is lower than the normal local oscillation frequency of the high end channel of the UHF band by several MHz and the same may be the frequency corresponding to one channel at the highest. Then the tuning voltage Vt obtained from the terminal 123 is applied as the voltage V3. The trimmer capacitor Tc4 included in the UHF local oscillator 113 is adjusted at that time, so that the normal local oscillation frequency of the low end channel of the UHF band is attained with the voltage V3. After the frequency of the UHF local oscillator 113 is thus adjusted, the input tuning circuit of the UHF high frequency amplifier 109 and the interstage tuning circuit 110 are adjusted so that the output of the UHF mixer 111 may be the normal intermediate frequency signal. More specifically, if and when the tuning voltage Vt is the upper limit voltage restricted by the zener diode ZD, trimmer capacitors Tc5, Tc6 and Tc7 and the corresponding trimmer loops TL1, TL2 and TL3 are adjusted so that the normal intermediate frequency may be attained at the highest receiving frequency of the UHF band. Then the trimmer capacitors Tc1, Tc2 and Tc3 are adjusted so that when the tuning voltage Vt is brought to the lower limit the normal intermediate frequency may be attained at the receiving lowest frequency of the UHF band. In general, adjustment of the difference between the local oscillation frequency and the input tuing and interstage tuning resonance frequencies to be the normal intermediate frequency is referred to as tracking adjustment. Such tracking adjustment should be made not only in the UHF high end and the UHF low end band but also in the region therebetween. Such tracking adjustment in the intermediate region is made by the trimmer loops TL1, TL2 and TL3. The characteristic of the receiving frequency with respect to the tuning voltage Vt is thus determined as shown by the curve U in FIG. 2, for example. Then the characteristic of the receiving frequency in the UHF band with respect to the tuning voltage Vt is determined through adjustment of the UHF portion.

Referring to FIG. 5B, the VHF portion of the tuner 100 is shown. The VHF portion comprises a VHF high frequency amplifier 103. The VHF high frequency amplifier 103 comprises an input tuning circuit, which receives a VHF television signal from the VHF antenna input terminal 117. The input tuning circuit comprised inductors L5 and L6, and a voltage controlled variable capacitance diode D5 cooperating with these inductors for determining the tuning frequency of the resonance circuit. Furthermore, the VHF high frequency amplifier 103 comprises an amplifying transistor T4, the output of which is applied to the primary resonance circuit constituting an interstage tuning circuit 104. The primary resonance circuit comprises a voltage controlled variable capacitance diode D6 and inductors L7 and L8 which are coupled to a secondary resonance circuit. The secondary resonance circuit comprises inductors L9 and L10 and a voltage controlled variable capacitance diode D7. Accordingly, the VHF television signal selected by the input tuning circuit of the VHF high frequency amplifier 103 is amplified by the transistor T4 and is applied through the primary resonance circuit and the secondary resonance circuit of the interstage tuning circuit 104 to a transistor T5 constituting a VHF mixer 105. On the other hand, the VHF local oscillator 107 comprises an oscillation transistor T6, a voltage controlled variable capacitance diode D8, and inductors L11 and L12. Switching diodes SD11, SD12, SD13 and SD14 are coupled to the input tuning circuit included in the VHF high frequency amplifier 103, the primary resonance circuit and the secondary resonance circuit of the interstage tuning circuit 104 and the VHF local oscillator 107. A VHF low band selecting voltage BL is applied from a terminal 129 to the cathodes of these switching diodes SD11 to SD14, and a VHF high band selecting voltage BH is applied from a terminal 131 to the anodes of these switching diodes SD11 to SD14. Accordingly, when the VHF high band is to be selected, the inductors L6, L8, L10 and L12 are removed from the respective resonance circuits, because the corresponding switching diodes SD11, SD12, SD13 and SD14 are rendered conductive by the band selecting voltage BH. Meanwhile, the transistor T5 of the VHF mixer 105 is supplied with the operation voltage not only on the occasion of VHF reception but also on the occasion of UHF reception, whereby the transistor T5 serves as a UHF intermediate frequency amplifier on the occasion of UHF reception. The output of the VHF mixer 105 is applied to the terminal 121 as the intermediate frequency signal. Meanwhile, a terminal 127 serving as a test point is connected to the output of the secondary resonance circuit of the interstage tuning circuit 104. A terminal 135 for an automatic fine tuning voltage is provided in association with the VHF local oscillator 107 and the UHF local oscillator 113, although not shown. A terminal 125 for an automatic gain control voltage is provided to supply an automatic gain control voltage to the transistor T1 shown in FIG. 5A and the transistor T4 shown in FIG. 5B.

Frequency adjustment of the VHF portion is made after the frequency adjustment of the UHF portion described previously is made. In the frequency adjustment of the VHF portion, first the VHF high band is adjusted, which is followed by adjustment of the VHF low band. However, the sequential order of adjustment of the VHF high band and the VHF low band may be reversed. First the voltage BH is applied to the terminal 131, whereby the VHF portion is placed in the VHF high band mode. Then, as the tuning voltage Vt the voltage V5 shown in FIG. 4, for example, is applied. The inductor L11 included in the VHF local oscillator 107 is adjusted, whereby adjustment is made for tuning to the high end channel E12 of the VHF high band. Thereafter, as the tuning voltage Vt the voltage V2 of FIG. 4 is applied and the inductor L11 is adjusted, so that the frequency is tuned to the low end channel of the VHF high band. Thereafter the inductors L5, L7 and L9 are adjusted to perform tracking adjustment.

Then, for the purpose of adjusting the VHF low band, the voltage BL is applied to the terminal 129. Then as the tuning voltage Vt the voltages V1 and V4 shown in FIG. 4 are applied and the inductance L12 is adjusted, so that the frequency may be tuned to the low end channel and the high end channel of the VHF low band. At that time, adjustment is made such that the lower limit of the local oscillation frequency may be lower than the normal local oscillation frequency of the low end channel E2 by several MHz, say within 7 MHz. On the other hand, tracking adjustment is made by adjusting the inductors L6, L8 and L10. After the above described adjustment is made in each of the frequency bands, adjustment of the VHF high band is made again to correct an influence caused by adjustment of the VHF low band.

As a matter of practice, the above described frequency adjustment is determined in consideration of a temperature drift of the local oscillation frequency of the UHF local oscillator 113 and the VHF local oscillator 107, a time dependent drift, and pull-in frequency and a holding range of an automatic frequency tuning operation.

In making frequency adjustment, consideration is given to a temperature drift and a time dependent drift of the local oscillation frequency of the UHF local oscillator 113 and a pull-in frequency of an automatic fine tuning operation. More specifically, the temperature drift of the local oscillation frequency of the UHF local oscillator 113 in a tuner presently available is within ±1.5 MHz in the temperature variation range of −10° C. to +60° C. and a time dependent dift of the local oscillation frequency of the UHF local oscillator is within ±2 MHz, while the pull-in range of the automatic fine tuning operation is ±1.5 MHz. Accordingly, the highest receivable frequency in the UHF band may be determined to a frequency higher than the highest channel (E69) by 2 MHz. By selecting the highest frequency in the above described manner, the total sum (+7 MHz) of the temperature drift (+1.5 MHz)+the time dependent drift (+2 MHz)+the pull-in range of the automatic fine tuing operation (+1.5 MHz) and the above described 2 MHz would be a frequency range which involves a possibility of deviation toward a higher frequency exceeding the above described highest receiving channel. Since the frequency range allowed for the upper limit of the UHF channel in West Germany is 8 MHz, it follows that there is still a margin of 1 MHz even in the worst situation in consideration of the above described various drifts and the pull-in range and accordingly the tuner thus implemented still suffices to meet the requirement of the FTZ standard. Even when the temperature drift and the time dependent drift have exerted an influence upon a lower frequency, such drifts would be −1.5 MHz and −2 MHz, respectively. Since adjustment has been made to a frequency higher than the normal frequency of the highest channel by 2 MHz in making the above described adjustment, no problem is caused in reception of the highest channel.

On the other hand, the minimum receivable frequency of the VHF low band may be determined to the frequency lower than the minimum channel (E2) by 1.5 MHz. For example, a temperature drift of the oscillation frequency of the VHF local oscillator 107 is within ±0.4 MHz in a temperature variation range of −10° C. to +60° C. and a time dependent drift is within ±1.0 MHz. A pull-in range of the automatic frequency tuning is ±1.5 MHz. Accordingly, in consideration of the above described minimum receivable frequency, the total (−4.4 MHz) of the temperature drift (−0.4 MHz)+the time dependent drift (−1 MHz)+the pull-in range of the automatic fine tuning (−1.5 MHz)+(−1.5 MHz) is a frequency range in which the frequency could drift in the lower direction to be lower than the lowest receiving channel. Since the frequency range allowed for the lower limit of the VHF low band in West Germany is 7 MHz, there is still a margin of 2.6 MHz even in consideration of the above described drifts and the pull-in range and even in the worst situation. Accordingly, the inventive tuner thus implemented can fully meet the requirement of the FTZ Standard. Even when the frequency is changed to be higher due to the temperature drift and the time dependent drift, such drifts are +0.4 MHz and +1.5 MHz and, since adjustment has been made such that the frequency may be lower by 1.5 MHz than the normal frequency of the lowest channel, no influence is exerted upon reception of such lowest channel (the low end channel).

FIG. 6 is a schematic diagram showing one embodiment of the present invention. Referring to FIG. 6, the tuning voltage generating circuit 200 is connected to provide the tuning voltage Vt to the tuner 100 described previously. It is pointed out that the circuit path including the terminal 137 and zener diode ZD shown by the dotted line in FIG. 6 may be applied to the FIG. 8 embodiment to be described subsequently. Now several preferred embodiments of the tuning voltage generating circuit 200 shown in FIG. 6 will be described in the following with reference to FIGS. 7 to 18.

Figure 7:
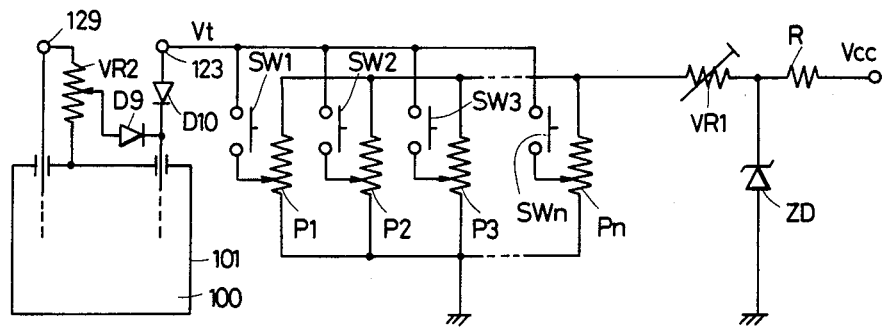
FIGS. 7, 8 and 9 are outline views for depicting different embodiments of the present invention wherein different types of channel selecting apparatuses, i.e. variable tuning voltage generating means are employed, respectively.

FIG. 7 is a schematic diagram of a major portion of a preferred embodiment of the tuning voltage generating circuit. In the FIG. 7 embodiment the zener diode ZD is used to restrict the upper limit of the tuning voltage Vt. The voltage being applied through the resistor R from the voltage source Vcc is made to a constant voltage by means of the zener diode ZD. The constant voltage thus attained by the zener diode is adjusted by means of a semifixed resistor VR1 so as to attain the tuning voltage V6 only for tuning to the high end channel E69 of the UHF band. On the other hand, the tuning voltage V1 tunable to the low end channel E2 of the VHF low band is applied through the variable resistor VR2 from the terminal 129 of the VHF low band setting voltage BL of the tuner 100. Potentiometers or variable resistors P1 to Pn are provided in parallel between the tuning voltage supplying terminal 123 and the output of the semifixed resistor VR1 so as to provide a predetermined tuning voltage in association with the respective channels. By closing one of the switches SW1 to SWn connected to the respective sliding contacts of the potentiometers, the voltage of the potentiometer corresponding to the closed switch is applied from the terminal 123 through the diode D10 to the tuner 100. Even if any of the potentiometers is adjusted to provide a voltage lower than the lower limit V1 of the tuning voltage, since the voltage set by the variable resistor VR2 is higher than that voltage, the diode D10 is reverse biased to be turned off, so that the voltage lower than the voltage Vt is prevented from being supplied to the tuner 100. In such a case, the lower limit voltage V1 adjusted by the variable resistor VR2 is applied through the diode D9 to the tuner 100. According to the FIG. 7 embodiment, the upper limit of the tuning voltage Vt is restricted as the voltage V6 and the lower limit of the tuning voltage Vt is restricted as the voltage V1. Accordingly, as previously shown in FIG. 4, the maximum receivable frequency of the UHF band and the minimum receivable frequency of the VHF low band are restricted. Meanwhile, the tuning voltage generating circuit 200 has been adapted to provide the voltage of V6=V5=V4, and V1=V2=V3 to the tuner 100 and the same applies to various embodiments to be described subsequently as well as the FIG. 7 embodiment. By doing so, an advantage is brought about that the restricting means of the tuning voltage may be adapted to determine only the upper limit and the lower limit. Accordingly, it is not necessary to determine the upper limit and the lower limit of the tuning voltage Vt individually for each of the receiving bands. Therefore, a circuit configuration may be very simple.

Furthermore, the FIG. 7 embodiment is adapted such that the voltage BL for setting the VHF low band is used to obtain the voltage V1. The purpose is that, since it is sufficient to define the minimum receivable frequency of at least the VHF low band with the voltage V1, utilization of the voltage BL makes simple the structure. Accordingly, the band setting voltage BL need not be utilized for the purpose of obtaining the voltage V1, as done in the FIG. 7 embodiment, and the voltage may be withdrawn from any other arbitrary portion. Therefore, the tuner may be structured such that the voltage V1 is always obtained in any of the receiving bands. Meanwhile, the semifixed resistor VR1 is provided for the purpose of fine tuning and is not necessarily required.

Figure 8:
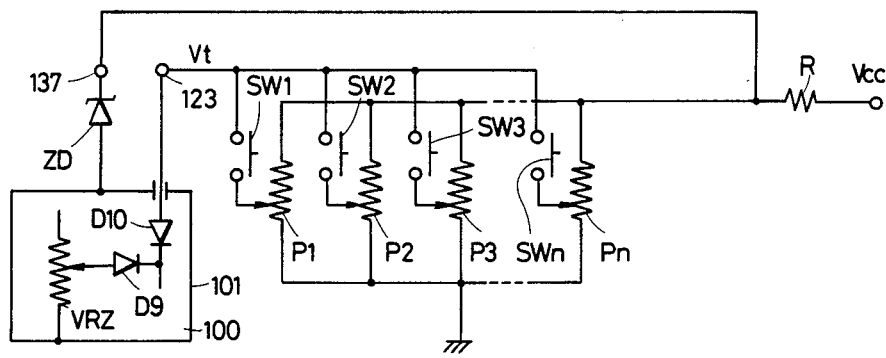

FIG. 8 shows a modification of the FIG. 7 embodiment. The FIG. 8 embodiment employs the path shown by the dotted line in FIG. 6, for the purpose of setting the upper limit voltage V6 of the tuning voltage Vt. The variable resistor VR2 for the purpose of setting the lower limit voltage V1 is provided inside the tuner 100.

Figure 9:
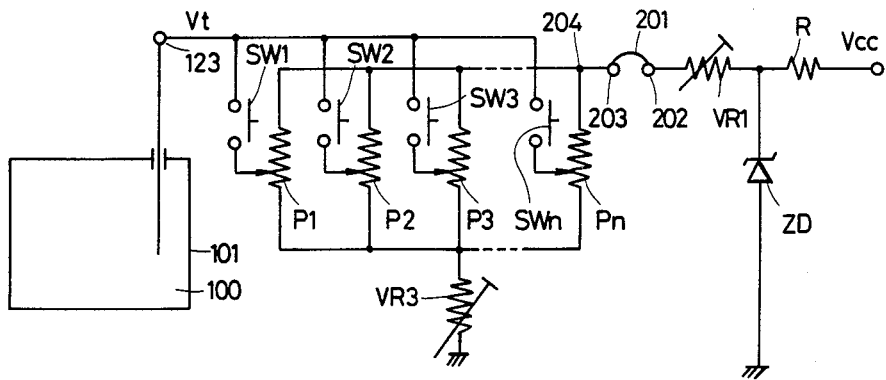

FIG. 9 shows a schematic diagram of a major portion of a further preferred embodiment of the tuning voltage generating circuit. FIG. 9 is of a simplest example. More specifically, the embodiment shown employs a jumper wire 201. In the embodiment, first the jumper wire 201 is removed and the voltage of +30 V, for example, is applied to the junction 204 from an external voltage source, not shown. The minimum voltage V1 of the tuning voltage Vt is determined by adjusting the variable semifixed resistor VR3 connected between one end of each of the potentiometers P1 to Pn and the ground potential. Then the jumper wire 201 is connected between the terminals 202 and 203 and a voltmeter, not shown, is connected to the junction 204. By looking at the voltmeter, the semifixed resistor VR1 is adjusted so that the indication of the voltmeter may be +30 V, whereby the maximum voltage V6 of the tuning voltage Vt is determined. The jumper wire 201 is kept connected between the terminals 202 and 203 even when the tuner is built in a television receiver.

Figure 12:
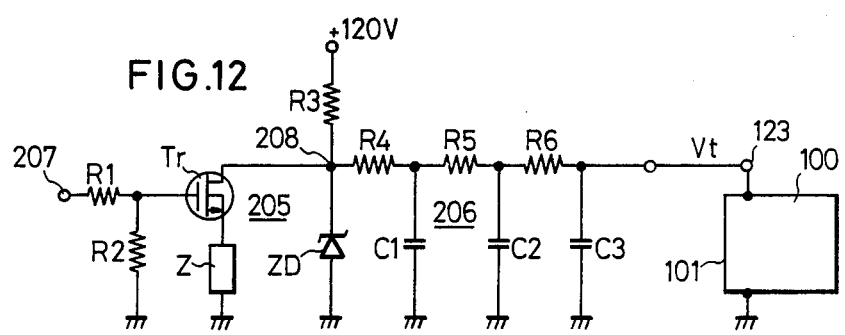
Figure 13:
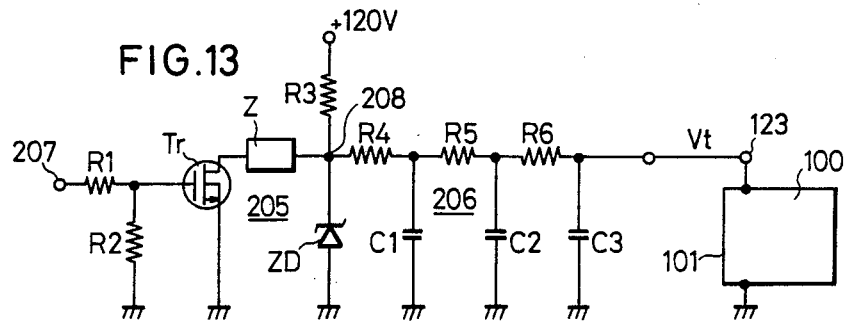
Figure 14:
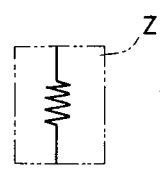
FIGS. 14 and 15 are schematic diagrams showing examples of impedance means.
Figure 15:
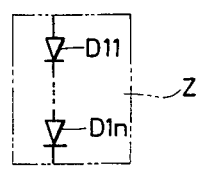

FIGS. 10 to 13 show further preferred embodiments of the tuning voltage generating circuit and FIGS. 14 and 15 are views showing one example of the impedance means for use in the above described embodiments. The embodiments shown in FIGS. 10 to 13 are the tuning voltage generating circuit of the so-called voltage synthesizer type. A channel selecting apparatus of a voltage synthesizer type is disclosed in, for example, U.S. Pat. No. 3,968,440 issued July 6, 1976 to George John Ehni, III.

Figure 10:
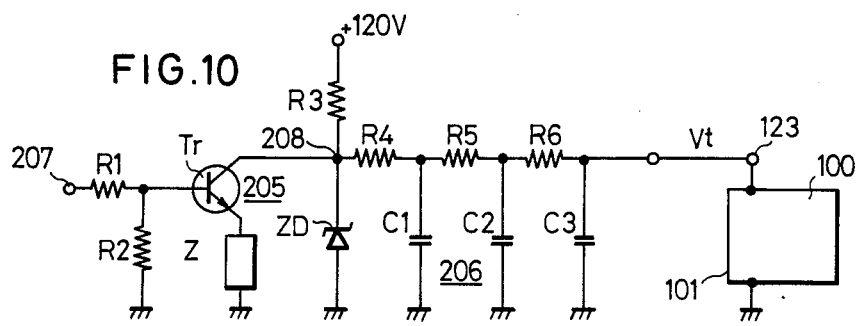
FIGS. 10 to 13 are schematic diagrams of major portions of further preferred embodiments of the tuning voltage generating circuit.
Figure 16A:
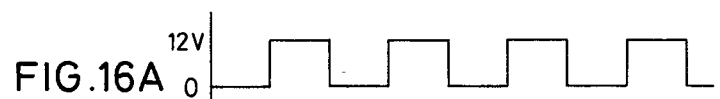
FIGS. 16A, 16B, 16C and 16D are a graph showing waveforms for explaining the operation of the embodiments shown in FIGS. 10 and 13.

Referring to the FIG. 10 embodiment, a pulse signal as shown in FIG. 16A is applied from the terminal 207. The pulse width of such pulse signal is controlled by a control circuit, not shown, so that the same may be that associated with the designated channel. The conduction period of the switching transistor Tr included in the switching circuit 205 is controlled as a function of the pulse signal applied from the terminal 207 and during the conduction period of the transistor Tr a current flows from the voltage source of +120 V through the resistor R3 to the transistor Tr. Accordingly, a voltage of the magnitude associated with the conduction period of the transistor Tr, i.e. the pulse width of the pulse signal thus applied appears at the junction or at the input of the smoothing circuit 206. The voltage appearing at the junction 208 is smoothed by the smoothing circuit 206 and is applied to the terminal 123 of the tuner 100 as the tuning voltage Vt. In the embodiment shown the impedance means Z is interposed in the current path of the switching circuit 205, i.e. the emitter circuit of the transistor Tr. Furthermore, the zener diode ZD is connected between the junction 208 and the ground. The zener diode ZD serves to restrict the input voltage of the smoothing circuit 206 and thus the upper limit of the tuning voltage Vt to the constant voltage (V6). On the other hand, the impedance means Z serves to restrict the lower limit (V1) of the tuning voltage Vt. More specifically, the voltage V on the occasion of conduction of the transistor Tr, at the junction 208 becomes $V = (120 - V_{CE}) \times [(Z + v_{CE})/(R3 + Z)]$ by means of the impedance means Z, where the voltage $V_{CE}$ is a saturated voltage between the collector and emitter electrodes on the occasion of conduction of the transistor Tr. On the other hand, in the absence of the impedance means Z, the voltage V is equal to the voltage $V_{CE}$ and accordingly the voltage V in the presence of the impedance means Z is higher than that in the absence of the impedance means Z by the value $(120 - V_{CE}) \times [Z/(R3 + Z)]$. Accordingly, the lower limit of the tuning voltage Vt is restricted to the constant voltage V1 (say 1.25 V). Thus, according to the FIG. 10 embodiment, the impedance means Z is interposed so that a given residual voltage may appear at the output point 208 even when the switching element is rendered conductive and therefore the lower limit of the tuning voltage Vt is prevented from undesirably becoming lower than the voltage V1.

Figure 11:
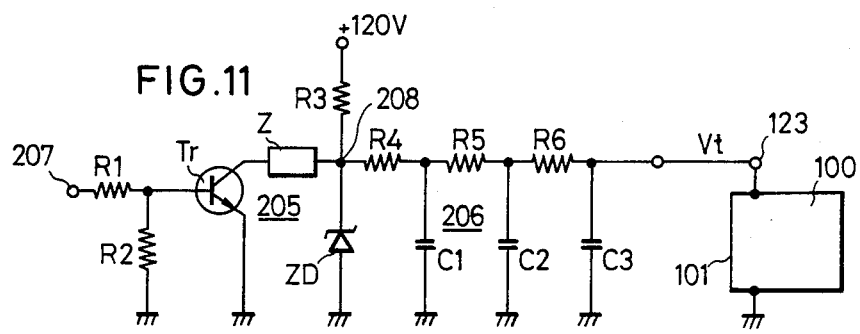

FIG. 11 shows an example in which the impedance means Z is not connected between the emitter electrode of the switching transistor Tr and the junction 208 but between the collector electrode of the switching transistor Tr and the junction 208. In this case as well, a residual impedance exists in the current path on the occasion of conduction of the switching transistor Tr and accordingly a given residual voltage arises at the junction 208. Accordingly, the tuning voltage Vt is restricted so that the same may not become lower than the constant voltage V1.

FIGS. 12 and 13 show examples wherein a field effect transistor is used as the switching transistor Tr, while the remaining portions thereof are the same as those in the embodiments shown in FIGS. 10 and 11.

FIG. 14 shows one example of the impedance means Z. The FIG. 14 embodiment employs a resistor as the impedance means Z.

FIG. 15 shows another example of the impedance means Z. The FIG. 15 embodiment employs a series connection of a plurality of diodes D11 to D1n as the impedance means Z. Meanwhile, the connecting direction of the series connection of the diodes is selected such that the current flowing direction in the current path of the switching element 205 may be the forward direction of the series connection. In employing the series connection of the diodes D11 to D1n as the impedance means Z, the voltage V' of the junction 208 becomes $V' = V_{CE} + nVak$, where Vak is a forward drop voltage for each of the diodes D1 to Dn. Accordingly, in the case where the impedance means Z is implemented by a series connection of the diodes, the voltage V is increased by the total nVak of the drop voltages of the diodes and accordingly the tuning voltage Vt is restricted to the constant voltage V1.

Figure 16B:
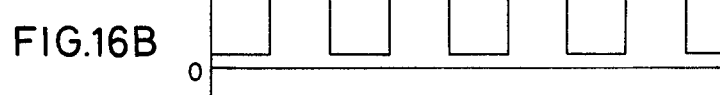
Figure 16C:
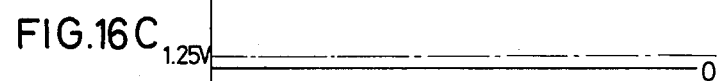
Figure 16D:
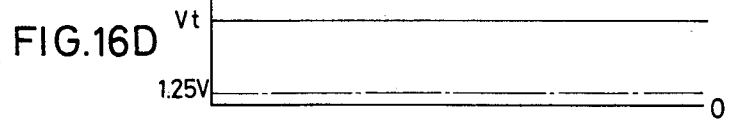

Now representing the others the operation of the FIG. 10 embodiment in combination with the FIG. 14 embodiment will be described in more detail with reference to FIG. 16. A pulse signal (FIG. 16A) having the pulse width corresponding to the designated channel is applied from the pulse signal circuit, not shown, to the terminal 207. The transistor Tr is rendered conductive as a function of the pulse width of the pulse signal. At that time, the voltage at the junction 208 remains at the voltage V1 described previously even on the occasion of conduction of the transistor Tr by means of the impedance means Z, i.e. the resistor, without becoming $0(V_{CE})$. Accordingly, the voltage appearing at the junction 208 as shown in FIG. 16B is smoothed by the smoothing circuit 206 to a direct current without including a ripple component as shown in FIGS. 16C and 16D. The pulse width of the pulse signal at that time is extremely large and, even if the transistor Tr had been rendered conductive for a substantial portion of the period, the lower limit is restricted by the resistor connected to the emitter electrode of the transistor Tr and the direct current voltage, i.e. the tuning voltage Vt will neither become lower than the constant voltage V1 (say 1.25 V).

Figure 17:
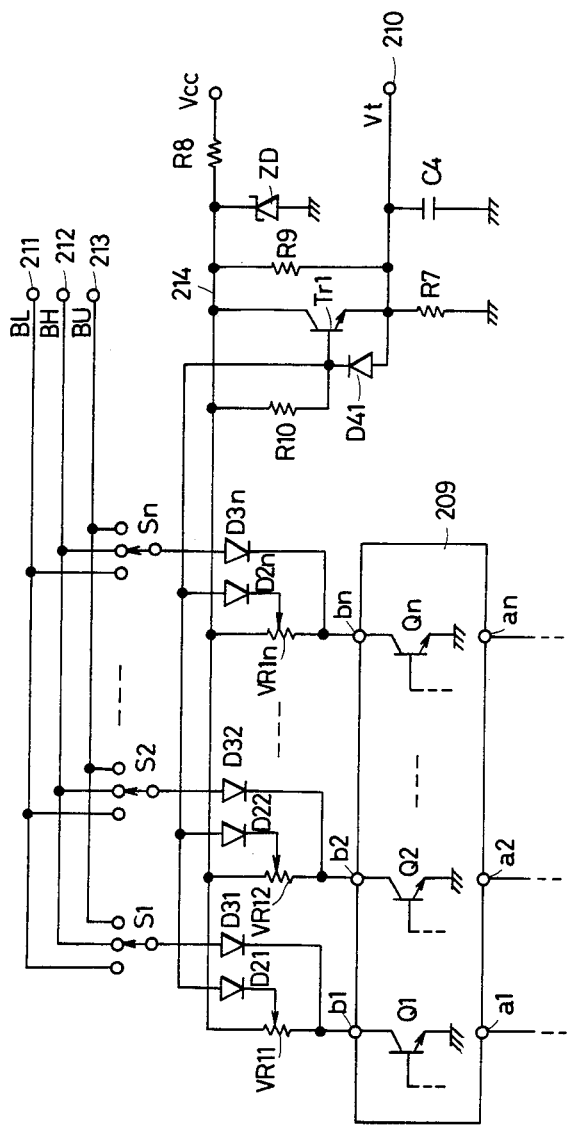
FIG. 17 is a schematic diagram of a major portion of a further preferred embodiment of the tuning voltage generating circuit.
Figure 18:
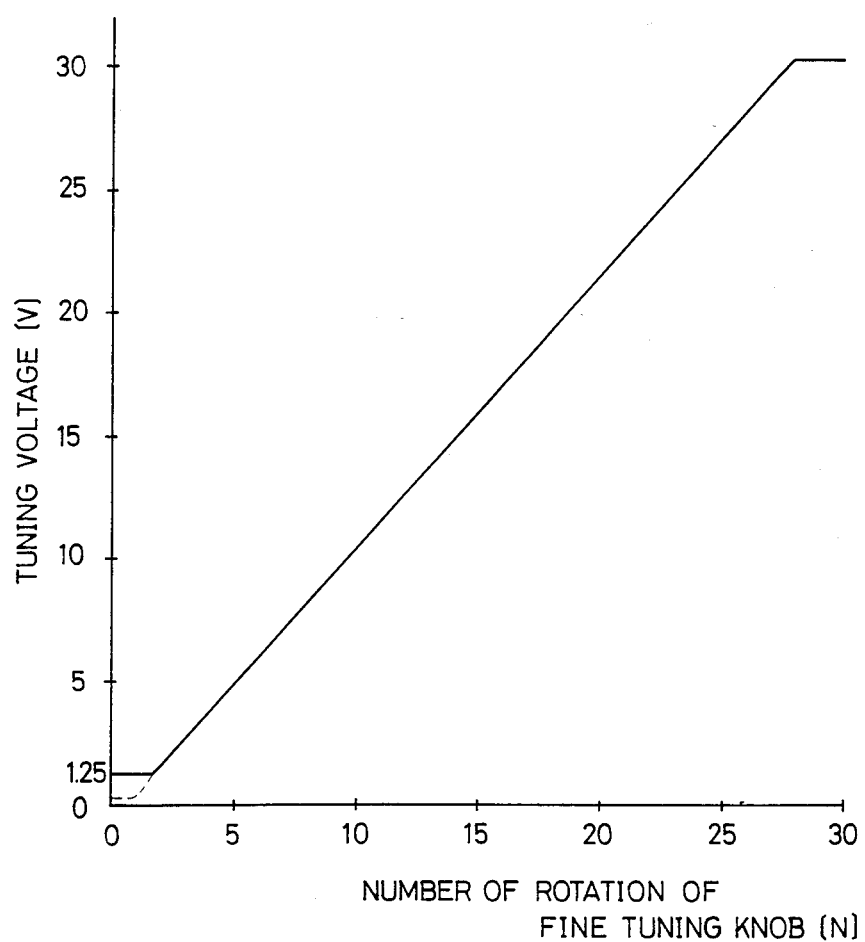
FIG. 18 is a graph depicting the operation of the FIG. 7 embodiment, wherein the abscissa indicates the number of rotations of a fine tuning knob and the ordinate indicates the tuning voltage.

FIG. 17 is a schematic diagram of a major portion of a further embodiment of the tuning voltage generating circuit and FIG. 18 is a graph explaining the operation thereof. A characteristic feature of the embodiment shown is that the resistor R9 is connected between the collector and emitter electrodes of the transistor Tr1.

In operation, a channel selecting signal is applied to any one of the input terminals a1 to an of the channel setting portion 209 implemented by an integrated circuit, for example. Then one of transistors Q1 to Qn corresponding to the channel selecting signal is rendered conductive and a current flows from the voltage source Vcc to the corresponding one of the variable resistors VR11 to VR1n corresponding to the transistor now in conduction. Accordingly, one of diodes D21 to D2n connected to the sliding contact of the variable resistor corresponding to the transistor now in conduction is also rendered conductive and the voltage being set by the corresponding variable resistor is applied to the base electrode of the transistor Tr1. The transistor Tr1 has the base electrode commonly connected to the anodes of the respective diodes D21 to D2n, as described previously, and also connected through the resistors R8 and R10 to the voltage source Vcc and has the emitter electrode connected to the output resistor R7 and the ripple removing capacitor C4. Meanwhile, the diode D41 is connected in parallel in a reverse direction between the base and emitter electrodes of the transistor Tr1. The diode D41 is rendered conductive in the case where the tuning voltage Vt from the output terminal 210 changes from a high value to a low value, thereby to help a discharge of the capacitor C4. The transistor Tr1 is provided to compensate for a variation of the tuning voltage Vt caused by a variation of the drop voltages by the diodes D21 to D2n depedning on the temperature and such compensation is achieved by a PN junction interposed in the reverse direction with respect to these diodes D21 to D2n. The zener diode ZD is aimed to restrict the upper limit of the tuning voltage Vt at the predetermined value V6. The input terminals 211, 212 and 213 are the input terminals for the band setting voltages BL, BH and BU, respectively, and are selectively connected to the terminals b1 to bn of the channel setting portion 209 by means of the selecting switches S1 to Sn. Meanwhile, the diodes D31 to D3n are aimed to connect the terminals 211 to 213 and the terminals b1 to bn only with respect to the selected channel and not to connect them with respect to the other channels.

In the embodiment shown the resistor R9 is connected between the voltage source line 214 and the output resistor R7. Accordingly a constant current normally flows in the output resistor R7 through the resistor R9 irrespective of conduction or non-conduction of the transistor Tr1. Therefore, a constant drop voltage is obtained due to such constant current at both ends of the output resistor R7, i.e. at the output terminal 210. Accordingly, by properly selecting the ratio of the resistors R9 and R7, the lower limit of the tuning voltage Vt can be restricted to the constant voltage V1. For example, if and when the voltage of the voltage source line 214 is 32 V, the resistor R7 is selected to be 100kΩ and the resistor R9 is selected to be approximately 2.2MΩ. Then, the lower limit of the tuning voltage Vt is restricted with the constant voltage V1 (say 1.25 V).

More specifically, referring to the FIG. 17 diagram, the voltage obtained from any one of the variable resistors VR11 to VR1n designated as a function of the selecting signal is applied to the base electrode of the transistor Tr1. Then the magnitude of the voltage and thus the conductivity of the transistor Tr1 is determined and accordingly the capacitor C4 is charged, while the voltage at the output terminal 210, i.e. the tuning voltage Vt increases to become the voltage value of the channel associated with the channel selecting signal. If and when the tuning voltage Vt is switched from that of a higher channel to that of a lower channel, the electric charge stored in the capacitor C4 is discharged through the diode D41 and accordingly the voltage at the output terminal 210 decreases, as described previously. However, in such a case, even if the voltage lower than the set voltage V1 (say 1.25 V is applied from any one of the variable resistors Vr1 to VRn to the base electrode of the transistor Tr1, no forward bias is applied between the base and emitter electrodes of the transistor Tr1 and therefore the transistor Tr1 is not rendered conductive, with the result that the tuning voltage Vt lower than the voltage Vt (say 1.25 V) will not appear at the output terminal 210.

On the other hand, the upper limit V6 of the tuning voltage Vt is restricted to a value lower than the voltage of the voltage source line 204 by the drop voltage between the collector and emitter electrodes of the transistor Tr1.

FIG. 18 shows a relation of the tuning voltage Vt with respect to the number of rotations of a fine tuning knob, not shown, in the case where the sliding contact of any one of the variable resistors VR1 to VR1n is moved by means of the fine tuning knob in the FIG. 17 embodiment. As seen from FIG. 18, even in case where the numer of rotations of the fine tuning knob, not shown, is extremely small, i.e. the voltage obtained from the variable resistor is small, the minimum value of the tuning voltage Vt will not become lower than the voltage V1 (say 1.25 V). In the absence of the resistor R9, when the number of rotations of the fine tuning knob is small, as shown by the dotted line in FIG. 18, the tuning voltage Vt would become approximately 0 V, with the result that the minimum receivable frequency of the VHF low band could be off the restriction by the FTZ standard, for example. Under the circumstances, the embodiments shown in FIGS. 7 to 18 are adapted such that the lower limit of the tuning voltage Vt is restricted with the constant voltage V1. On the other hand, a conventional tuner does not comprise such restrictions of the lower limit of the tuning voltage Vt and accordingly the voltage could become lower than 0.3 V. Accordingly, in order to restrict the minimum receivable frequency in the VHF low band so as to satisfy the requirements of the FTZ standard, it is necessary to design a tuner such that the minimum channel (E2) can be received with the tuning voltage of approximately 0.5 V. However, reception performance of the channel E2 is degraded as compared with that of the other channels. The reason is that the lower the tuning voltage being applied the worse the quality factor of the voltage controlled variable capacitance diode. By contrast, by restricting the lower limit of the tuning voltage Vt to the constant voltage V1 (say 1.25 V), as done in the present invention, it is sufficient to design the tuner such that the channel E2 can be received with such a relatively high tuning voltage and performance of the tuner is enhanced.

It goes without saying that the embodiments shown in FIGS. 7 to 18 can be employed not only for adaptation to the FTZ standard but also for adaptation to other standards such as the DOC standard.

Figure 19:
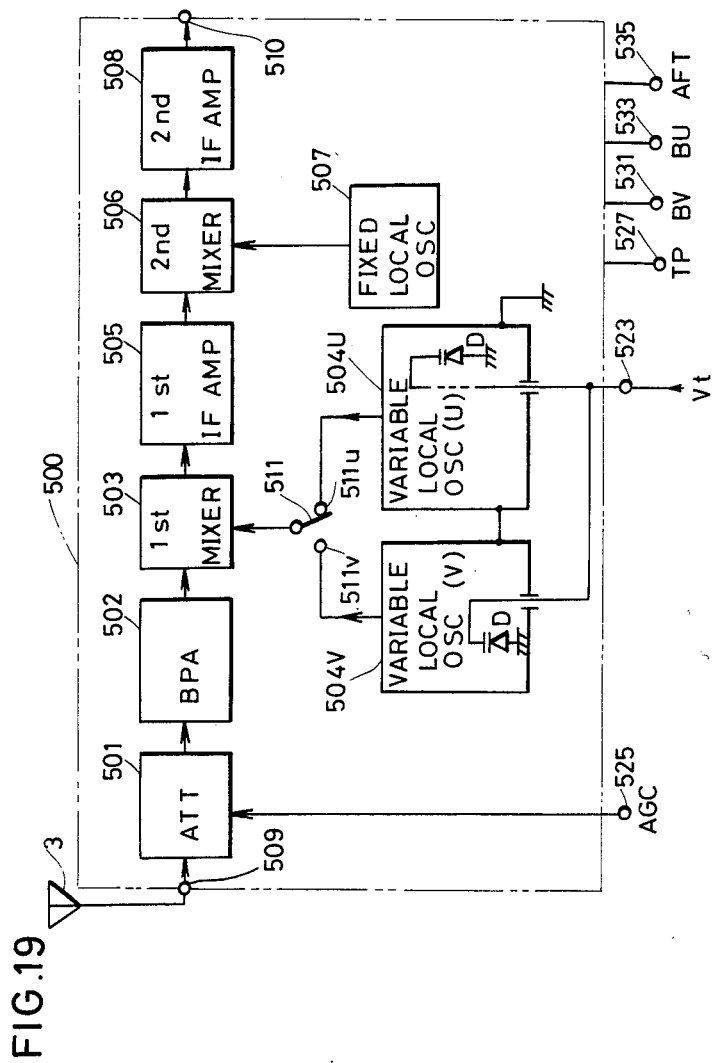
FIG. 19 is a block diagram showing still a further embodiment of the present invention.

FIG. 19 is a modification of a television tuner of a double conversion type. A television tuner of such double conversion type is disclosed in, for example, U.S. Pat. No. 3,639,840 issued Feb. 1, 1972 to Jacob Shekel et al. In such television tuner of a double conversion type, it is necessary to change the tuning frequency in a wide range from the VHF low band to the UHF high band by the use of a single variable local oscillator. However, in achieving such a wide range of the tuning frequency using only a single voltage controlled variable local oscillator, a difficulty is caused in the local oscillator 504 and in order to prevent such difficulty two voltage controlled variable local oscillators 504V and 504U have been employed in the FIG. 19 embodiment. More specifically, the variable local oscillator 504V is used for the VHF band and is adapted to be variable over the frequency range from 2,000 to 2,350 MHz. On the other hand, the voltage controlled variable local oscillator 504U is provided for the UHF band and is adapted to be variable over the frequency range from 2,500 to 2,900 MHz, for example. The oscillation outputs of these two variable local oscillators 504V and 504U are applied to the contacts 511V and 511U of a band selsecting switch 511. The switch 511 is switched responsive to the band selecting voltages BV and BU being applied to band selecting voltage terminals 531 and 533 provided in the tuner 500. More specifically, if and when the VHF band selecting voltage BV for selecting the VHF band is applied from the channel selecting apparatus, not shown, to the terminal 531, the switch 511 is turned to the contact 511V. On the other hand, if and when the UHF band selecting voltage BU is applied from the terminal 533, the switch 511 is turned to the contact 511u. Accordingly, when the VHF band is to be selected, the oscillation output from the variable local oscillator 504V is applied to the first mixer 503. Conversely, if the UHF band is to be selected, the oscillation output from the variable load oscillator 504U is applied to the first mixer.

FIG. 20 is a graph showing a relation between the broadcasting channels (frequencies) and the tuning voltage in the case where the FIG. 10 embodiment is employed as a television tuner for the West Germany standard. Even in case of scuh modified embodiment of double conversion type, it is sufficient to supply the tuning voltage Vt having the upper limit and the lower limit restricted as shown in FIGS. 7 to 18 to the terminal 523. By doing so, the maximum receivable frequency in the UHF band and the minimum receivable frequency in the UHF band are restricted with the constant tuning voltages V6 and V1, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuner apparatus comprising:
   a tuning circuit having a plurality of receiving bands, said tuning circuit including a voltage controlled variable reactance means used for said plurality of receiving bands;
   single tuning voltage generating means coupled to said tuning circuit for generating a tuning voltage and applying said tuning voltage to said voltage controlled variable reactance means, said generating means being provided for all of said plurality of receiving bands;
   maximum receivable frequency defining means, including a trimmer loop and resonance conductors provided in said tuning circuit for determining the maximum receivable frequency of the highest of said plurality of receiving bands of said tuning circuit with respect to the highest tuning voltage within a predetermined range;
   single upper limit restricting means coupled to said tuning voltage generating means for restricting the upper limit of said tuning voltage applied to said voltage controlled variable reactance means to, or slightly higher than, said highest tuning voltage;
   minimum receivable frequency defining means, including an adjustable capacitor and resonance conductors provided in said tuning circuit for determining the minimum receivable frequency of the lowest of said plurality of receiving bands of said tuning circuit with respect to the lowest tuning voltage within a predetermined range; and
   single lower limit restricting means coupled to said tuning voltage generating means for restricting the lower limit of said tuning voltage applied to said voltage controlled variable reactance means to, or slightly lower than, said lowest tuning voltage.

2. A tuner apparatus comprising:
   a tuning circuit having a plurality of receiving bands, said tuning circuit including a voltage controlled variable reactance means used for said plurality of receiving bands;

single tuning voltage generating means coupled to said tuning circuit for generating a tuning voltage and applying said tuning voltage to said voltage controlled variable reactance means, said generating means being provided for all of said plurality of receiving bands;

maximum receivable frequency defining means, including a trimmer loop and resonance conductors provided in said tuning circuit for determining the maximum receivable frequency of the highest of said plurality of receiving bands of said tuning circuit with respect to the highest tuning voltage within a predetermined range; and single upper limit restricting means coupled to said tuning voltage generating means for restricting the upper limit of said tuning voltage applied to said voltage controlled variable reactance means to, or slightly higher than, said highest tuning voltage.

3. A tuner apparatus comprising:

a tuning circuit having a plurality of receiving bands, said tuning circuit including a voltage controlled variable reactance means used for said plurality of receiving bands;

single tuning voltage generating means coupled to said tuning circuit for generating a tuning voltage and applying said tuning voltage to said voltage controlled variable reactance means, said generating means being provided for all of said plurality of receiving bands;

minimum receivable frequency defining means, including an adjustable capacitor and resonance conductors provided in said tuning circuit for determining the minimum receivable frequency of the lowest of said plurality of receiving bands of said tuning circuit with respect to the lowest tuning voltage within a predetermined range; and single lower limit restricting means coupled to said tuning voltage generating means for restricting the lower limit of said tuning voltage applied to said voltage controlled variable reactance means to, or slightly lower than, said lowest tuning voltage.

4. A tuner apparatus in accordance with either one of claims 1 or 2 which is built in a television receiver, and which is adapted to be tunable to three receiving bands including a UHF band, a VHF high band, and a VHF low band, and wherein said maximum receivable frequency defining means comprise means for setting said tuning voltage corresponding to said maximum receivable frequency of said UHF band to be equal to or higher than said tuning voltage corresponding to the respective maximum receivable frequencies of said VHF high band and said VHF low band.

5. A tuner apparatus in accordance with either one of claims 1 or 3, which is built in a television receiver, and which is adapted to be tunable to three receiving bands including a UHF band, a VHF high band, and a VHF low band, and wherein said minimum receivable frequency defining means comprise means for setting said tuning voltage corresponding to said minimum receivable frequency of said VHF low band to be equal to or lower than said tuning voltage corresponding to the respective minimum receivable frequencies of said UHF band and said VHF high band.

6. A tuner apparatus in accordance with either one of claims 1 or 2 which is built in a television receiver and which is adapted to be tunable to two receivable bands including a UHF band and a VHF band, and wherein said maximum receivable frequency defining means comprise means for setting said tuning voltage corresponding to said maximum receivable frequency of said UHF band to be equal to or higher than said tuning voltage corresponding to said maximum receivable frequency of said VHF band.

7. A tuner apparatus in accordance with either one of claims 1 or 3, which is built in a television receiver, and which is adapted to be tunable to two receiving bands including a UHF band and a VHF band, and wherein said minimum receivable frequency defining means comprise means for setting said tuning voltage corresponding to said minimum receivable frequency of said VHF band to be equal to or lower than said tuning voltage corresponding to said minimum receivable frequency of said UHF band.

8. A tuner apparatus in accordance with claim 1, wherein said tuning voltage generating means comprises a pulse signal source for generating a pulse signal;

switching means responsive to said pulse signal;

a voltage source for supplying a constant voltage; and tuning voltage withdrawing means coupled to said switching means for withdrawing a voltage associated with a conduction period of said switching means as said tuning voltage, and said lower limit restricting means comprising impedance means coupled to said switching means for causing a voltage drop with a given residual voltage when said switching means is rendered conductive.

9. A tuner apparatus in accordance with claim 8, wherein said impedance means comprises resistive means.

10. A tuner apparatus in accordance with claim 8, wherein said impedance means comprises a diode junction the forward direction of which is selected to be in a current flow direction from said switching means.

11. A tuner apparatus in accordance with claim 9, wherein said switching means comprises a transistor.

* * * * *